(12) United States Patent
Namiki et al.

(10) Patent No.: US 9,417,532 B2
(45) Date of Patent: *Aug. 16, 2016

(54) COATING AGENT FOR FORMING FINE PATTERN

(71) Applicant: Tokyo Ohka Kogyo Co., Ltd., Kawasaki-shi (JP)

(72) Inventors: Takumi Namiki, Kawasaki (JP); Tomoya Kumagai, Kawasaki (JP); Kento Asoya, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 10 days.

This patent is subject to a terminal disclaimer.

(21) Appl. No.: 14/668,421

(22) Filed: Mar. 25, 2015

(65) Prior Publication Data

US 2015/0277228 A1  Oct. 1, 2015

(30) Foreign Application Priority Data

Mar. 26, 2014  (JP) .................... 2014-064578

(51) Int. Cl.
| | |
|---|---|
| G03F 7/40 | (2006.01) |
| G03F 7/039 | (2006.01) |
| G03F 7/30 | (2006.01) |
| G03F 7/32 | (2006.01) |

(52) U.S. Cl.
CPC ........ *G03F 7/40* (2013.01); *G03F 7/039* (2013.01); *G03F 7/0392* (2013.01); *G03F 7/30* (2013.01); *G03F 7/32* (2013.01); *G03F 7/322* (2013.01); *G03F 7/325* (2013.01); *G03F 7/327* (2013.01)

(58) Field of Classification Search
None
See application file for complete search history.

(56) References Cited

U.S. PATENT DOCUMENTS

| | | | | |
|---|---|---|---|---|
| 5,112,526 | A * | 5/1992 | Kuroda | B01J 13/20 252/363.5 |
| 9,063,430 | B2 * | 6/2015 | Kumagai | G03F 7/40 |
| 2003/0102285 | A1 * | 6/2003 | Nozaki | G03F 7/0035 216/41 |
| 2003/0143490 | A1 | 7/2003 | Kozawa et al. | |
| 2006/0124586 | A1 * | 6/2006 | Kobayashi | C11D 1/72 216/41 |
| 2010/0233634 | A1 * | 9/2010 | Noya | G03F 7/425 430/325 |
| 2015/0017590 | A1 * | 1/2015 | Kumagai | G03F 7/40 430/328 |

FOREIGN PATENT DOCUMENTS

| | | | |
|---|---|---|---|
| JP | 2001-109144 | * | 4/2001 |
| JP | 2003-215814 | | 7/2003 |

OTHER PUBLICATIONS

Machine-assisted English translation of JP 2001-109144 provided by JPO (2001).*

* cited by examiner

*Primary Examiner* — Sin Lee
(74) *Attorney, Agent, or Firm* — Knobbe Martens Olson & Bear LLP

(57) ABSTRACT

A coating agent for forming a fine pattern capable of simultaneously achieving slimming and roughness reduction of a positive-type resist pattern without deteriorating the cross-sectional shape of the slimmed positive type resist pattern and a method of slimming treatment of a positive-type resist pattern using the above coating agent for forming a fine pattern. A coating agent comprising a nitrogen-containing compound with a specific structure and an organic solvent is used as the coating agent for forming fine pattern used for a positive-type resist pattern. The coating agent may include a basic nitrogen-containing compound and/or a water-soluble polymer or an alkali-soluble polymer.

9 Claims, No Drawings

COATING AGENT FOR FORMING FINE PATTERN

This application claims priority to Japanese Patent Application No. 2014-064578, filed Mar. 26, 2014, the entire content of which is incorporated herein by reference.

BACKGROUND OF THE INVENTION

1. Field of the Invention

The present invention relates to a coating agent for forming fine pattern and a method of slimming treatment on a positive type resist pattern using the above coating agent for forming fine pattern.

2. Related Art

In the production of electronic components, such as semiconductor devices and liquid crystal devices, photolithographic techniques have been used when a process such as etching is performed on a substrate. In the photolithographic techniques, a coat film (resist layer) is formed on a substrate using a so-called photoresist material responsive to actinic radiation, then the resist layer is selectively irradiated with the actinic radiation in order to perform light exposure, and thereafter a developing treatment is performed to selectively dissolve and remove the resist layer so as to form an image pattern (resist pattern) on the substrate. Then, a wiring pattern is formed on the substrate by carrying out an etching process with this resist pattern as a protective layer (mask pattern).

In unison with a recent growing tendency to highly integrate and miniaturize semiconductor devices, fine-fabrication in the formation of these resist patterns has also advanced and thus ultra-fine-processing is required. In addition to attempt to achieve such ultra-fine-fabrication of the resist pattern, research and development of techniques have been performed in order for the pattern fine-fabrication to exceed the resolution limit of the resist materials also in view of pattern formation methods.

For example, as a method of forming an ultra-fine resist pattern, a method using a coating agent containing at least one selected from a water-soluble resin and an alkali-soluble resin is known (Patent Document 1). According to the method described in Patent Document 1, an ultra-fine resist pattern is formed by applying a coating agent on the surface of a resist pattern formed on a substrate to form a coat film, and then developing with water or a weakly alkaline aqueous solution.

In the method, the coat film is formed on the surface of a resist pattern having a resist section comprising a resist composition and a nonresist section, and then the surface of the resist section is impregnated with a resin component contained in the coat film to form a mixing layer on the surface of the resist section. Then, through removal of the mixing layer along with the coat film by development, a fine resist pattern comprising a resist section having a smaller dimension by the amount of the removed mixing layer as compared with that of the resist pattern before applying the coating agent (hereinafter, a process of fining a resist pattern by reducing a dimension of a resist section through removal and dissolution of a surface layer of the resist pattern is also referred to as slimming).

Patent Document 1: Japanese Unexamined Patent Application, Publication No. 2003-215814

SUMMARY OF THE INVENTION

In general, fine unevenness is present on the surface of a resist section in a resist pattern, and it is desired to reduce the roughness of the surface of the resist section due to this fine unevenness. However, when fining a resist pattern by the method of forming a mixing layer described in Patent Document 1, it is difficult to reduce the roughness of the surface of a resist section in a resist pattern. The reason behind this is as follows: in the case of the method described in Patent Document 1, a mixing layer is formed by impregnating the surface of a resist section with a resin component in a coat film, and therefore the mixing layer is formed into a shape reflecting the unevenness on the surface of the resist section.

Further, according to the method described in Patent Document 1, mixing at the surface of a resist section occurs not only at the side of the resist section but also at the apex portion. For this reason, defects when performing fining of a resist pattern according to the method described in Patent Document 1 include the following: the height of a patterned section will be reduced; the cross-sectional shape of the patterned section in a resist pattern will be of a shape having a round apex portion although the cross-sectional shape of the patterned section is desirably rectangular in ordinary cases; and the like. In a case where these defects occur, a process margin for etching may be decreased, for example, when etching is performed using the resist pattern as an etching mask.

The present invention is made in view of the above problem. An object of the present invention is to provide a coating agent for forming fine pattern capable of simultaneously achieving slimming and roughness reduction of a positive-type resist pattern without deteriorating the cross-sectional shape of a slimmed positive type resist pattern. Another object of the present invention is to provide a method of slimming treatment of a positive-type resist pattern using the above coating agent for forming fine pattern.

The present inventors find that the above problem can be solved by using a coating agent comprising an (A) nitrogen-containing compound with a specific structure and an (B) organic solvent as a coating agent for forming fine pattern used for a positive-type resist pattern. Then the present inventors have completed the present invention.

A first aspect of the present invention is a coating agent for fine-fabrication of a pattern used for forming a coat film on a surface of a positive-type resist pattern formed on a substrate to form a fine pattern, comprising an (A) nitrogen-containing compound and a (B) organic solvent, wherein the (A) nitrogen-containing compound is a compound having an alkyl group, bound to a nitrogen atom, with 8 or more carbon atoms, and 4 moles or more of ethylene oxide and/or propylene oxide is bound to 1 mole of the nitrogen atom that the alkyl group is bound to.

A second aspect of the present invention is the coating agent for fine-fabrication of a pattern according to the first aspect, wherein the (A) nitrogen-containing compound is a compound represented by the following formula (1) or formula (2):

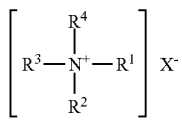

wherein, in the formula (1), $R^1$ represents an alkyl group having 8 or more carbon atoms, and $R^2$ represents a group represented by $-(A-O)_q-R^5$, and $R^3$ represents a hydrogen atom, an alkyl group, a hydroxyalkyl group or a group represented by $-(A-O)_r-R^5$;

in the formula (2), $R^1$ and $R^2$ are similarly defined as in the formula (1), and $R^3$ represents an alkyl group, a hydroxyalkyl group or a group represented by $-(A-O)_r-R^5$, and $R^4$ represents an alkyl group, a hydroxyalkyl group or a group represented by $-(A-O)_s-R^5$, and $X^-$ represents a monovalent anion; and "A" represents an ethylene group or a propylene group, and $R^5$ represents a hydrogen atom or an alkyl group, and q, r and s are the numbers of average repetitions of a divalent group represented by $-A-O-$, and q is a positive number, and r and s are each 0 or a positive number, and q+r+s is 4 or more.

A third aspect of the present invention is the coating agent for fine-fabrication of a pattern according to the second aspect, wherein the $R^3$ is a group represented by $-(A-O)_r-H$ in the formula (1).

A fourth aspect of the present invention is the coating agent for fine-fabrication of a pattern according to the second aspect, wherein the $R^3$ is a group represented by $-(A-O)_r-H$, and the $R^4$ is a group represented by $-(A-O)_s-H$ in the formula (2).

A fifth aspect of the present invention is the coating agent for fine-fabrication of a pattern according to the first aspect, wherein the (B) organic solvent is one or more selected from the group consisting of alcohols optionally having a fluorine atom, hydrocarbons, ethers not having a hydroxy group and fluorinated aliphatic hydrocarbons optionally having an ether linkage or an ester linkage.

A sixth aspect of the present invention is the coating agent for fine-fabrication of a pattern according to the first aspect, further comprising a (C) basic nitrogen-containing compound other than an alkylene oxide adduct of the (A) nitrogen-containing compound.

A seventh aspect of the present invention is the coating agent for fine-fabrication of a pattern according to the sixth aspect, wherein the (C) basic nitrogen-containing compound is a quaternary ammonium hydroxide represented by the following formula (C1):

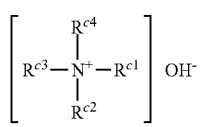

wherein, in the formula (C1), $R^{c1}$, $R^{c2}$, $R^{c3}$, $R^{c4}$ are the same, or are different, and each independently represents a group selected from the group consisting of an alkyl group, a hydroxyalkyl group and an aralkyl group.

An eighth aspect of the present invention is the coating agent for fine-fabrication of a pattern according to the first aspect, further comprising a (D) water-soluble polymer or an alkali-soluble polymer.

A ninth aspect of the present invention is a method of slimming treatment of a positive-type resist pattern, the method comprising:

coating a positive-type resist pattern on a substrate with a coat film comprising the coating agent for fine-fabrication of a pattern according to the first aspect, dissolving and removing the coat film from the positive-type resist pattern, and obtaining a positive-type resist pattern having a resist section in the pattern finer than that in the positive-type resist pattern before coated with the coat film.

A tenth aspect of the present invention is the method of slimming treatment of a positive-type resist pattern according to the ninth aspect, the method comprising:

coating the positive-type resist pattern with a coat film comprising the coating agent for fine-fabrication of a pattern and heating the positive-type resist pattern coated with the coat film.

An eleventh aspect of the present invention is a coating agent comprising an (A) nitrogen-containing compound and a (B) organic solvent, wherein the (A) nitrogen-containing compound is a compound having an alkyl group, bound to a nitrogen atom, with 8 or more carbon atoms and 4 moles or more of ethylene oxide and/or propylene oxide is bound to 1 mole of the nitrogen atom bound to the alkyl group.

A twelfth aspect of the present invention is the coating agent according to the eleventh aspect, that is used for fine-fabrication of a pattern, and used for formation of a coat film on a surface of a positive-type resist pattern formed on a substrate to form a fine pattern.

A thirteenth aspect of the present invention is the coating agent according to the eleventh aspect, wherein the (A) nitrogen-containing compound is a compound represented by the following formula (1) or formula (2):

wherein, in the formula (1), $R^1$ represents an alkyl group having 8 or more carbon atoms, and $R^2$ represents a group represented by $-(A-O)_q-R^5$, and $R^3$ represents a hydrogen atom, an alkyl group, a hydroxyalkyl group or a group represented by $-(A-O)_r-R^5$;

in the formula (2), $R^1$ and $R^2$ are similarly defined as in the formula (1), and $R^3$ represents an alkyl group, a hydroxyalkyl group or a group represented by $-(A-O)_r-R^5$, and $R^4$ represents an alkyl group, a hydroxyalkyl group or a group represented by $-(A-O)_s-R^5$, and $X^-$ represents a monovalent anion; and "A" represents an ethylene group or a propylene group, and $R^5$ represents a hydrogen atom or an alkyl group, and q, r and s are the numbers of average repetitions of a divalent group represented by $-A-O-$, and q is a positive number, and r and s are each 0 or a positive number, and q+r+s is 4 or more.

A fourteenth aspect of the present invention is the coating agent according to the thirteenth aspect, wherein, in the formula (1), the $R^3$ is a group represented by -(A-O)$_r$—H.

A fifteenth aspect of the present invention is the coating agent according to the thirteenth aspect, wherein, in the formula (2), the $R^3$ is a group represented by -(A-O)$_r$—H, and the $R^4$ is a group represented by -(A-O)$_s$—H.

A sixteenth aspect of the present invention is the coating agent according to the eleventh aspect, wherein the (B) organic solvent is one or more selected from the group consisting of alcohols optionally having a fluorine atom, hydrocarbons, ethers not having a hydroxy group and fluorinated aliphatic hydrocarbons optionally having an ether linkage or an ester linkage.

A seventeenth aspect of the present invention is the coating agent according to the eleventh aspect, further comprising a (C) basic nitrogen-containing compound other than the (A) nitrogen-containing compound.

An eighteenth aspect of the present invention is the coating agent according to the seventeenth aspect, wherein the (C) basic nitrogen-containing compound is a quaternary ammonium hydroxide represented by the following formula (C1):

wherein, in the formula (C1), $R^{c1}$, $R^{c2}$, $R^{c3}$, $R^{c4}$ are the same, or are different, and each independently represents a group selected from the group consisting of an alkyl group, a hydroxyalkyl group and an aralkyl group.

A nineteenth aspect of the present invention is the coating agent according to the eleventh aspect, further comprising a (D) water-soluble polymer or an alkali-soluble polymer.

A twentieth aspect of the present invention is a method of slimming treatment of a positive-type resist pattern, the method comprising:

coating a positive-type resist pattern on a substrate with a coat film comprising the coating agent according to the eleventh aspect, dissolving and removing the coat film from the positive-type resist pattern, and obtaining a positive-type resist pattern having a resist section in the pattern finer than that in the positive-type resist pattern before coated with the coat film.

A twenty-first aspect of the present invention is the method according to the twentieth aspect comprising:

heating the positive-type resist pattern after being coated with the coat film.

The present invention can provide a coating agent for forming fine pattern capable of simultaneously achieving slimming and roughness reduction of a positive-type resist pattern without deteriorating the cross-sectional shape of the slimmed positive type resist pattern; and a method of slimming treatment of a positive-type resist pattern using the above coating agent.

DETAILED DESCRIPTION OF THE INVENTION

Coating Agent for Forming Fine Pattern

The coating agent for forming fine pattern according to the present invention (hereinafter, also referred to as the coating agent) comprises an (A) nitrogen-containing compound with a predetermined structure and a (B) organic solvent. The roughness on a patterned surface can be reduced while fining a resist in a pattern by treating a positive-type resist pattern with the coating agent according to the present invention by a predetermined method. Considering the slimming amount of a pattern and the like, it is preferred to include a component selected from a (C) basic nitrogen-containing compound other than the (A) nitrogen-containing compound and a (D) water-soluble polymer or an alkali-soluble polymer.

Below, essential or optional components to be included in the coating agent for forming fine pattern according to the present invention will be described.

Alkylene Oxide Adduct of (A) Nitrogen-Containing Compound

The coating agent contains an alkylene oxide adduct of the (A) nitrogen-containing compound with a specific structure. The alkylene oxide adduct of the (A) nitrogen-containing compound is a compound having an alkyl group, bound to a nitrogen atom, with 8 or more carbon atoms, and 4 moles or more, preferably 5 moles or more, and more preferably 7 moles or more of ethylene oxide and/or propylene oxide is bound to 1 mole of the nitrogen atom that the alkyl group is bound.

There is no particular limitation for the number nitrogen atoms contained in the alkylene oxide adduct of the (A) nitrogen-containing compound as long as the alkylene oxide adduct of the (A) nitrogen-containing compound has a predetermined structure. However, usually, the number is preferably 1.

The alkylene oxide adduct of the (A) nitrogen-containing compound having the above structure has surfactant-like properties due to having an oxyethylene unit and an oxypropylene unit as well as a long alkyl group. For this reason, in a case where the coating agent according to the present invention is used, the alkylene oxide adduct of the (A) nitrogen-containing compound is easily adsorbed in a preferred fashion into the surface of a resist section in a positive-type resist pattern. The alkylene oxide adduct of the (A) nitrogen-containing compound adsorbed into the surface of a resist section appears to promote the solubilization of the surface layer of the resist section by the surfactant-like effect thereof.

Usually, fine unevenness and a small amount of an alkali-soluble group from undissolved residues in the development process are present on the surface of a side of a resist section. Because of this, the surface of a side of a resist section which has not been fully dissolved in the development process due to insufficient deprotection appears to be partly dissolved in the alkylene oxide adduct of the (A) nitrogen-containing compound based on its basic properties when well adsorbed into the side of the resist section. In contrast, since the alkali-soluble groups are not mostly present at the apex portion of an unexposed resist section, the alkylene oxide adduct of the (A) nitrogen-containing compound mostly does not affect the apex portion and does not cause the dissolution of a resist at the apex portion although adsorbed therein. Therefore, it is conceived that when performing pattern fining using the coating agent according to the present invention, the surface of a resist pattern can be smoothed, and the roughness of a positive-type resist pattern can be reduced without causing the height of a patterned section to be decreased and without causing the cross-sectional shape of the patterned section to be round at the apex portion.

As the (A) nitrogen-containing compound, a compound represented by the following formula (1) or the following formula (2) is preferable.

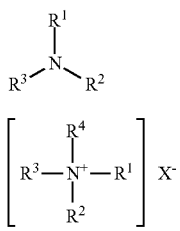

(In the formula (1), $R^1$ represents an alkyl group having 8 or more carbon atoms, $R^2$ represents a group represented by $-(A-O)_q-R^5$, and $R^3$ represents a hydrogen atom, an alkyl group, a hydroxyalkyl group, or a group represented by $-(A-O)_r-R^5$. In the formula (2), $R^1$ and $R^2$ are the same as in formula (1), $R^3$ represents an alkyl group, a hydroxyalkyl group, or a group represented by $-(A-O)_r-R^5$, $R^4$ represents an alkyl group, a hydroxyalkyl group, or a group represented by $-(A-O)_s-R^5$, and $X^-$ represents a monovalent anion. A represents an ethylene group or a propylene group, $R^5$ represents a hydrogen atom or an alkyl group, q represents a positive number, r and s each represent 0 or a positive number, and q+r+s represents 4 or more.)

For the compounds represented by the formula (1) and the formula (2), $R^1$ preferably represents an alkyl group having 8 or more carbon atoms, and more preferably an alkyl group having 12 or more carbon atoms. As R', the number of carbon atoms of the alkyl group is preferably 20 or less. As $R^1$, the structure of the alkyl group is not particularly limited, but may be in the form of a linear chain or in the form of a branched chain.

As $R^1$, a preferable specific example of the alkyl group may include an n-octyl group, an octane-2-yl group, an octane-3-yl group, a 2-ethylhexyl group, a 5-methyl-heptyl group, an n-nonyl group, a nonane-2-yl group, a nonane-3-yl group, an n-decyl group, an isodecyl group, a decan-2-yl group, a decan-3-yl group, a 7,7-dimethyl octyl group, an n-undecyl group, an undecan-2-yl group, an undecan-3-yl group, an n-dodecyl group, a dodecan-2-yl group, a dodecan-3-yl group, a dodecan-4-yl group, an n-tridecyl group, a tridecan-2-yl group, an n-tetradecyl group, a tetradecan-2-yl group, an n-pentadecyl group, an n-hexadecyl group, a hexadecan-2-yl group, an n-heptadecyl group, an n-octadecyl group, an octadecan-2-yl group, an n-nonadecyl group, an n-icosyl group and an icosan-2-yl group.

For the groups represented by $-(A-O)_q-R^5$, $-(A-O)_r-R^5$, and $-(A-O)_s-R^5$ included in the compounds represented by the formula (1) and the formula (2), q, r, and s represent the average addition numbers of ethylene oxide and/or propylene oxide to a nitrogen atom, respectively, and in some cases, they may not be integers.

For the groups represented by $-(A-O)_q-R^5$, $-(A-O)_r-R^5$, and $-(A-O)_s-R^5$ included in the compounds represented by formula (1) and formula (2), $R^5$ represents a hydrogen atom or an alkyl group, and preferably, a hydrogen atom. In the case when $R^5$ represents an alkyl group, the number of the carbon atoms is preferably 1 to 6, and more preferably 1 to 4. In the case when $R^5$ represents an alkyl group, a specific example may include a methyl group, an ethyl group, an n-propyl group, an isopropyl group, an n-butyl group, an n-pentyl group, and an n-hexyl group.

For the compound represented by the formula (1), it is preferable that $R^2$ represent the group represented by $-(A-O)_q-H$ and $R^3$ represent the group represented by $-(A-O)_r-H$. For the compound represented by the formula (2), it is preferable that $R^2$ represent the group represented by $-(A-O)_q-H$, $R^3$ represent the group represented by $-(A-O)_r-H$, and $R^4$ represent the group represented by $-(A-O)_s-H$.

In the formula (1) and the formula (2), the value of q+r+s is 4 or more, preferably 4 or more and 25 or less, more preferably 4 or more and 20 or less, and in particular preferably 7 or more and 20 or less. By blending a compound in which ethylene oxide and/or propylene oxide is bound to a nitrogen atom with the coating agent as the alkylene oxide adduct of the (A) nitrogen-containing compound so that the value of q+r+s falls within the above range, a positive-type resist pattern can be well slimmed, and the roughness can be reduced.

In the formula (1) and the formula (2), in the case when $R^3$ or $R^4$ represents an alkyl group or a hydroxyalkyl group, the numbers of the carbon atoms of the alkyl group and hydroxyalkyl group are not particularly limited, but preferably are 1 to 8, and more preferably 1 to 6. In the case when $R^3$ or $R^4$ represents an alkyl group, a specific example may include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, and an n-octyl group. In the case when $R^3$ or $R^4$ represents a hydroxyalkyl group, a specific example may include a hydroxymethyl group, a 2-hydroxyethyl group, a 3-hydroxy-n-propyl group, a 4-hydroxy-n-butyl group, a 5-hydroxy-n-pentyl group, a 6-hydroxy-n-hexyl group, a 7-hydroxy-n-heptyl group, and an 8-hydroxy-n-octyl group.

In the formula (2), $X^-$ is not particularly limited in the range that does not hinder the objects of the present invention. $X^-$ is preferably a hydroxide ion, halide ion such as a chloride ion, a bromide ion, and an iodide ion, and more preferably a hydroxide ion.

A preferable example of the compound represented by the formula (1) may be as follows. For the following formula, m and n represent positive numbers and m+n represents 4 or more.

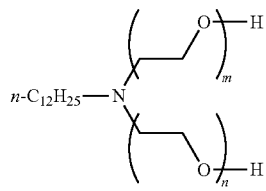

A preferable example of the compound represented by the formula (2) may be as follows. For the following formula, m, n, and l represent positive numbers and m+n+l represents 4 or more.

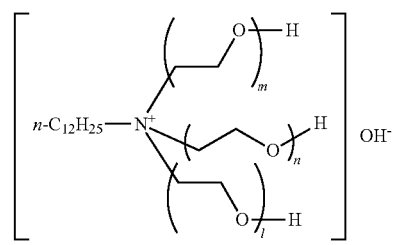

The alkylene oxide adduct of the (A) nitrogen-containing compound described above may be used in combination of two or more. There is no particular limitation for the content of the alkylene oxide adduct of the (A) nitrogen-containing compound in the coating agent as long as it is within a range where the objects of the present invention are not impaired. The content of the alkylene oxide adduct of the (A) nitrogen-containing compound in the coating agent is preferably 0.001 mass % or more and 1 mass % or less relative to the total liquid amount of the coating agent, more preferably 0.01 mass % or more and 0.8 mass % or less, in particular preferably 0.05 mass % or more and 0.5 mass % or less.

(B) Organic Solvent

The coating agent comprises the (B) organic solvent as a solvent to dissolve a component such as the (A) nitrogen-containing compound, the (C) basic nitrogen-containing compound as described below and the (D) water-soluble polymer or the alkali-soluble polymer. In a case where the coating agent comprises the (B) organic solvent as a solvent, even if a positive-type resist pattern is coated with the coating agent using a cup for applying a positive-type resist composition, cloudiness is not developed in the cup. Therefore, cup exchange is not required when performing coating with the coating agent, and a slimmed positive-type resist pattern can be effectively formed. Further, the coating agent comprising the (B) organic solvent as a main component has a good wettability on a positive-type resist pattern.

The (B) organic solvent is appropriately selected from various organic solvents not dissolving a positive-type resist pattern is. As the (B) organic solvent, preferred are those in which a positive-type resist pattern is essentially insoluble. However, the (B) organic solvent shall not be limited to those in which a positive-type resist pattern is completely insoluble. For example, in a case where a positive-type resist pattern is brought into contact with an organic solvent at room temperature, an organic solvent is allowed to use in which the positive-type resist pattern is dissolved to an extent where the width thereof is decreased by only 1 nm or less, preferably 0.5 nm or less.

Examples of a suitable organic solvent include one or more selected from the group consisting of alcohols optionally having a fluorine atom, hydrocarbons, ethers not having a hydroxy group and fluorinated aliphatic hydrocarbons optionally having an ether linkage or an ester linkage. Below, the suitable organic solvents will be described (Alcohols Optionally Having a Fluorine Atom)

The alcohol may be a monohydric alcohol or a polyhydric alcohol with a valency of 2 or more. The alcohol may be alkanol not having a fluorine atom, or may be fluoroalkanol having a fluorine atom. Further, the alcohol may include an ether linkage. Furthermore, the alcohol may have a chain structure or a cyclic structure, or may have a structure in which a chain structure and a cyclic structure are combined.

Specific examples of the chain alcohol having neither a fluorine atom nor an ether linkage include ethanol, n-propanol, isopropyl alcohol, propylene glycol, n-butanol, isobutanol, sec-butanol, tert-butanol, n-pentanol, sec-pentanol, tert-pentanol, isopentanol, neopentyl alcohol, 2-methyl-1-butanol, n-hexanol, 4-methyl-2-pentanol, 2-ethylbutanol, n-heptanol, 3-heptanol, 5-methyl-1-hexanol, n-octanol, 2-octanol, 3-octanol, 4-octanol, 6-methyl-2-heptanol and 2-ethyl-1-hexanol.

Specific examples of the alcohol having a cyclic structure including neither a fluorine atom nor an ether linkage include cyclopentanemethanol, 1-cyclopentylethanol, cyclohexanol, cyclohexanemethanol (CM), cyclohexaneethanol, 1,2,3,6-tetrahydro benzyl alcohol, exo-norborneol, 2-methyl cyclohexanol, cycloheptanol, 3,5-dimethylcyclohexanol and benzyl alcohol.

Specific examples of the chain alcohol having an ether linkage but not a fluorine atom include monomethyl ether, monoethyl ether, monopropyl ether or monobutyl ether of a polyhydric alcohol selected from ethylene glycol, diethylene glycol, propylene glycol and dipropylene glycol. Among these, preferred are propylene glycol monobutyl ether (1-butoxy-2-propanol), propylene glycol monopropyl ether (1-propoxy-2-propanol), 2-(2-butoxyethoxyl)ethanol.

As the alcohol having a fluorine atom, those having 4 to 12 carbon atoms are preferred. Specific examples of the alcohol having a fluorine atom include $C_4F_9CH_2CH_2OH$ and $C_3F_7CH_2OH$.

Among the alcohols recited above, preferred are 1-butoxy-2-propanol (BP), isobutanol (2-methyl-1-propanol), 4-methyl-2-pentanol, n-butanol, propylene glycol monopropyl ether.

(Hydrocarbons)

The hydrocarbon is appropriately selected from paraffin based solvents. Examples of the hydrocarbon include n-heptane.

(Ethers not Having a Hydroxy Group)

Suitable examples of the ethers not having a hydroxy group include compounds represented by the following formula $R^{b1}$—O—$R^{b2}$. In the above formula, $R^{b1}$ and $R^{b2}$ each independently represents a monovalent hydrocarbon group, and $R^{b1}$ and $R^{b2}$ may join together to form a ring.

Suitable examples of $R^{b1}$ and $R^{b2}$ include an alkyl group, an aryl group, an aralkyl group and the like, and an alkyl group is preferred. Each of $R^{b1}$ and $R^{b2}$ is preferably an alkyl group, and $R^{b1}$ and $R^2$ are preferably the same alkyl group.

In a case where $R^{b1}$ and $R^{b2}$ are alkyl groups, there is no particular limitation for the structure and the number of carbon atoms thereof. The number of carbon atoms in the alkyl group is preferably 1 to 20, more preferably 1 to 15, and in particular preferably 1 to 10. The structure of the alkyl group may be any of linear, branched and cyclic.

Specific examples of the alkyl group include a methyl group, an ethyl group, an n-propyl group, an isopropyl group, an n-butyl group, an isobutyl group, an n-pentyl group, an isopentyl group, a cyclopentyl group, a hexyl group and the like, and an n-butyl group and an isopentyl group are particularly preferred.

In a case where $R^{b1}$ and $R^{b2}$ are aryl groups or aralkyl groups, there is no particular limitation for the structure and the number of carbon atoms thereof. The number of carbon atoms in the aryl group or the aralkyl group is preferably 6 to 12, and more preferably 6 to 10. For an aromatic ring in the aryl group or the aralkyl group, a part or all of the hydrogen atoms on the aromatic ring may be substituted with an alkyl group, an alkoxy group, a halogen atom and the like.

Specific examples of the aryl group or the aralkyl group include a phenyl group, a benzyl group, a naphthyl group and the like. In a case where the aryl group or the aralkyl group has an alkyl group as a substituent on the aromatic ring, the above alkyl group is preferably an alkyl group having 1 to 5 carbon atoms, more preferably a methyl group, an ethyl group, a propyl group, an n-butyl group and a tert-butyl group.

In a case where the aryl group or the aralkyl group has an alkoxy group as a substituent on the aromatic ring, the above alkoxy group is preferably an alkoxy group having 1 to 5 carbon atoms, more preferably a methoxy group and an ethoxy group.

In a case where the aryl group or the aralkyl group has a halogen atom as a substituent on the aromatic ring, the above halogen atom is preferably a fluorine atom.

In a case where $R^{b1}$ and $R^{b2}$ join together to form a ring, $R^{b1}$ and $R^{b2}$ are each independently a linear or branched alkylene group (preferably an alkylene group having 1 to 10 carbon atoms), and the end of $R^{b1}$ joins with the end of $R^{b2}$ to form a ring. Further, the above alkylene group may include an ether linkage in the chain thereof. Specific examples of the ethers in which $R^{b1}$ and $R^{b2}$ form a ring include 1,4-cineole, 1,8-cineole, pinene oxide, tetrahydrofuran, dioxane and the like.

Specific examples of the ethers not having a hydroxy group include 1,4-cineole, 1,8-cineole, pinene oxide, dimethyl ether, diethyl ether, methyl ethyl ether, di-n-propyl ether, diisopropyl ether, di-n-butyl ether, di-n-pentyl ether, diisopentyl ether (diisoamyl ether), dioxane, anisole, ethylbenzyl ether, diphenyl ether, dibenzyl ether, phenetole, butyl phenyl ether, tetrahydrofuran, ethyl propyl ether, diisopropyl ether, dihexyl ether, dipropyl ether and the like. Among these, 1,8-cineole, di-n-butyl ether and diisopentyl ether are preferred.

(Fluorinated Aliphatic Hydrocarbon Optionally Having an Ether Linkage or an Ester Linkage)

As the fluorinated aliphatic hydrocarbon optionally having an ether linkage or an ester linkage, those having 3 to 15 carbon atoms are preferably used.

The fluorinated aliphatic hydrocarbon having an ether linkage is preferably a fluorinated alkyl ether represented by $R^{b3}OR^{b4}$ (wherein $R^{b3}$ and $R^{b4}$ each independently represents an alkyl group, and the total number of carbon atoms in the both alkyl groups is 3 to 15, and at least a part or all of the hydrogen atoms thereof is(are) substituted with a fluorine atom. $R^{b3}$ and $R^{b4}$ may join together to form a ring.).

The fluorinated aliphatic hydrocarbon having an ester linkage is preferably a fluorinated alkyl ester represented by $R^{b5}COOR^{b6}$ ($R^{b5}$ and $R^{b6}$ each independently represents an alkyl group, and the total number of carbon atoms in the both alkyl groups is 3 to 15, and at least a part or all of the hydrogen atoms thereof is(are) substituted with a fluorine atom).

Suitable examples of the above fluorinated alkyl ether include a compound represented by the following formula (B-1) and fluoro-2-butyltetrahydrofuran. Further, suitable examples of the above fluorinated alkyl ester include compounds represented by the following formulae (B-2) and (B-3).

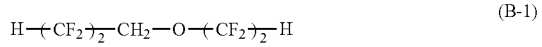

(B-1)

(B-2)

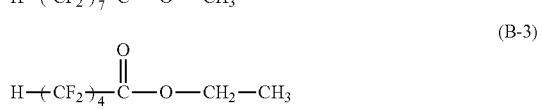

(B-3)

Among the organic solvents described above, preferred are isobutanol (2-methyl-1-propanol), 4-methyl-2-pentanol, propylene glycol monobutyl ether (1-butoxy-2-propanol (BP)), propylene glycol monopropyl ether (1-propoxy-2-propanol) and diisopentyl ether (diisoamyl ether).

The coating agent preferably comprises the (B) organic solvent alone as a solvent, but it may comprise water in a range where the objects of the present invention are not impaired. The content of water in the coating agent is preferably 10 mass % or less, more preferably 5 mass % or less, in particular preferably 3 mass % or less, and most preferably 1 mass % or less when the mass of the coating agent is taken as 100 mass %.

(C) Basic Nitrogen-Containing Compound

The coating agent may comprise the (C) basic nitrogen-containing compound. The (C) basic nitrogen-containing compound is a compound which is not the (A) nitrogen-containing compound. The slimming effect of the coating agent can be enhanced by blending the (C) basic nitrogen-containing compound into the coating agent.

The (C) basic nitrogen-containing compound is preferably a water-soluble amine compound and a basic quaternary ammonium salt, more preferably a basic quaternary ammonium salt.

Specific examples of the water-soluble amine compound include alkanolamines such as monoethanolamine, diethanolamine, triethanolamine, 2-(2-aminoethoxyl)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine; polyalkylene polyamines such as diethylenetriamine, triethylenetetramine, propylenediamine, N,N-diethylethylenediamine, 1,4-butanediamine, N-ethyl-ethylenediamine, 1,2-propanediamine, 1,3-propanediamine, 1,6-hexanediamine; aliphatic amines such as 2-ethylhexylamine, dioctylamine, triethylamine, tributylamine, tripropylamine, triallylamine, heptylamine, cyclohexylamine, tetrahydrofurfurylamine; aromatic amines such as benzylamine, diphenylamine; cyclic amines such as piperazine, N-methyl-piperazine, hydroxyethyl piperazine, 1,4-diazabicyclo(2,2,2)octane, 1,8-diazabicyclo(5,4,0)-7-undecene and the like.

The basic quaternary ammonium salt is preferably a quaternary ammonium hydroxide represented by the following formula (C1).

(C1)

(In the formula (C1), $R^{c1}$, $R^{c2}$, $R^{c3}$, $R^{c4}$ are the same, or are different, and each independently represents a group selected from the group consisting of an alkyl group, a hydroxyalkyl group and an aralkyl group.)

In the formula (C1), in a case where $R^{c1}$, $R^{c2}$, $R^{c3}$ and $R^{c4}$ are an alkyl group or a hydroxyalkyl group, there is no particular limitation for the number of carbon atoms in the alkyl group and the hydroxyalkyl group, but the number is preferably 1 to 8, more preferably 1 to 6. Specific examples of the alkyl group include a methyl group, an ethyl group, an n-propyl group, an isopropyl group, an n-butyl group, an isobutyl group, a sec-butyl group, a tert-butyl group, an n-pentyl group, an n-hexyl group, an n-heptyl and an n-octyl group. Specific examples of the hydroxyalkyl group include a hydroxymethyl group, 2-hydroxyethyl group, a 3-hydroxy-n-propyl group, a 4-hydroxy-n-butyl group, a 5-hydroxy-n-pentyl group, a 6-hydroxy-n-hexyl group, a 7-hydroxy-n-heptyl group, an 8-hydroxy-n-octyl group.

In the formula (C1), in a case where $R^{c1}$, $R^{c2}$, $R^{c3}$ and $R^{c4}$ are aralkyl groups, there is no particular limitation for the number of carbon atoms in the aralkyl group, but the number is preferably 7 to 12. Specific examples of the aralkyl group include a benzyl group, a phenethyl group, an α-naphthylmethyl group, a β-naphthylmethyl group, an α-naphthylethyl group, a β-naphthylethyl group and the like.

Specific examples of the quaternary ammonium hydroxide represented by the formula (C1) include tetramethylammonium hydroxide, trimethyl(2-hydroxyethyl)ammonium hydroxide, tetraethylammonium hydroxide, tetrapropylammonium hydroxide, tetrabutylammonium hydroxide, methyltripropylammonium hydroxide, methyltributylammonium hydroxide, benzyltrimethylammonium hydroxide, benzyltriethylammonium hydroxide and the like.

There is no particular limitation for the content of the (C) basic nitrogen-containing compound in the coating agent as long as it is within a range where the objects of the present invention are not impaired. The content of the (C) basic nitrogen-containing compound is preferably 0.1 to 5 mass %, more preferably 0.1 to 1 mass % when the mass of the coating agent is taken as 100 mass %.

(D) Water-Soluble Polymer or Alkali-Soluble Polymer

The coating agent for forming fine pattern may comprise the (D) water-soluble polymer or the alkali-soluble polymer in addition to the (A) nitrogen-containing compound and the (B) organic solvent. In a case where the coating agent comprises the (D) water-soluble polymer or the alkali-soluble polymer, the surface of a positive-type resist pattern is easily coated with a coat film having a desired and uniform thickness. Further, the effects of slimming and roughness improvement due to the coating agent can be enhanced by blending the (D) water-soluble polymer or alkali-soluble polymer into the coating agent.

Below, the water-soluble polymer and the alkali-soluble polymer will be described.

[Water-Soluble Polymer]

There is no particular limitation for the type of the water-soluble polymer as long as it can be uniformly dissolved into the coating agent at a concentration capable of forming a coat film having a desired film thickness on a positive-type resist pattern, which does not undergo gelation when dissolved in the coating agent.

Suitable examples of the water-soluble polymer include at least one selected from a polymer of one or more acrylic monomers, a polymer of one or more vinyl based monomers, a copolymer of an acrylic monomer and a vinyl based monomer, a cellulose based resin, an amide based resin and a water-soluble peptide.

Acrylic monomers include, for example, acrylic acid, methyl acrylate, methacrylic acid, methyl methacrylate, N,N-dimethylacrylamide, N,N-dimethylaminopropyl methacrylamide, N,N-dimethylaminopropyl acrylamide, N-methylacrylamide, diacetoneacrylamide, N,N-dimethylaminoethyl methacrylate, N,N-diethylaminoethyl methacrylate, N,N-dimethylaminoethyl acrylate, acryloyl morpholine and the like.

Vinyl based monomers include, for example, N-vinylpyrrolidone, vinylimidazolidinone, N-vinylimidazole, vinyl acetate, allylamine and the like.

In a case where a polymer of a vinyl based monomer, or a copolymer of an acrylic monomer and a vinyl based monomer has a constituent unit derived from vinyl acetate, an ester group in the above constituent unit may be hydrolyzed into a vinyl alcohol unit. Further, the hydroxy group in that vinyl alcohol unit may be protected with acetal and the like.

Cellulose based resins include, for example, hydroxypropyl methylcellulose phthalate, hydroxypropyl methylcellulose acetate phthalate, hydroxypropyl methylcellulose hexahydro phthalate, hydroxypropyl methylcellulose acetate succinate, hydroxypropyl methylcellulose, hydroxypropyl cellulose, hydroxyethylcellulose, cellulose acetate hexahydro phthalate, carboxymethyl cellulose, ethyl cellulose, methyl cellulose and the like.

Further, among the amide based resins, those soluble in water can also be used.

Among these, a vinyl based resin is preferred, and polyvinyl pyrrolidone and polyvinyl alcohol are particularly preferred.

The mass-average molecular weights of a polymer of one or more acrylic monomers, a polymer of one or more vinyl based monomers, a copolymer of an acrylic monomer and a vinyl based monomer, a cellulose based resin and an amide based resin are preferably 500 or more and 500000 or less, more preferably 1000 or more and 200000 or less.

There is no particular limitation for the water-soluble peptide as long as it is highly soluble in water at room temperature, and is resistant to gelation even at low temperature. The mass-average molecular weight of the water-soluble peptide is preferably 10000 or less, more preferably 5000 or less. In a case where the mass-average molecular weight is 10000 or less, it is highly soluble in water, and is resistant to gelation even at low temperature. Therefore, the stability of the solution will be high. Note that the lower limit of the mass-average molecular weight is preferably 500 or more. Further, the water-soluble peptide may be derived from a natural product, or may be a synthetic material. Moreover, it may be a derivative of the water-soluble peptide.

Water-soluble peptides include, for example, hydrolyzed peptides from collagen, hydrolyzed peptides from silk proteins, hydrolyzed peptides from soybean proteins, hydrolyzed peptides from wheat proteins, hydrolyzed peptides from rice proteins, hydrolyzed peptides from sesame proteins, hydrolyzed peptides from *Pisum sativum* proteins, hydrolyzed peptides from wool proteins, hydrolyzed peptides from casein and the like.

These water-soluble polymers may be used alone, or may be used as a mixture of two or more.

(Alkali-Soluble Polymer)

Alkali-soluble polymers include a resin having a hydrophilic alkali-soluble functional group such as a phenolic hydroxy group and a carboxyl group. Specific examples of the alkali-soluble polymer include, for example, a novolak resin, a resin (a PHS based resin) having a constituent unit derived from hydroxystyrene such as polyhydroxystyrene (PHS) and hydroxystyrene-styrene copolymer, an acrylic resin containing a constituent unit derived from acrylic ester and the like. Any one of these may be used alone, or two or more may be used in combination.

There is no particular limitation for the amount of the (D) water-soluble polymer or the alkali-soluble polymer in the coating agent, but it is appropriately selected in view of the viscosity of the coating agent and the like. In a case where the content of the (D) water-soluble polymer or the alkali-soluble polymer in the coating agent is preferably 0.01 to 10 mass %, more preferably 0.1 to 5 mass %, in particular preferably 0.1 to 2 mass % when the total mass of the coating agent is taken as 100 mass %.

(E) Optional Additive

The coating agent for forming fine pattern may comprise an optional additive such as a surfactant, a water-soluble fluorine compound, if desired, in a range where the effect of the present invention is not impaired. Below, these optional additives will be described in order.

Surfactant

A property of not generating a suspension in the coating agent and the like is required for the surfactant. Further, in a case where the coating agent contains the (D) water-soluble polymer or the alkali-soluble polymer, the surfactant desirably has a high solubility in the (D) water-soluble polymer or the alkali-soluble polymer. The use of such a surfactant that complies with these characteristics can suppress generation of air bubbles (microfoam), especially when applying the coating agent, thereby more effectively enabling prevention of defect generation reportedly related to the microfoam generation. In view of the foregoing aspects, one or more of a surfactant based on a phosphoric acid ester of polyoxyethylene, and a nonionic-based surfactant may be preferably used.

As the aforementioned surfactant based on a phosphoric acid ester of polyoxyethylene, a compound represented by the following formula (E1) is preferred.

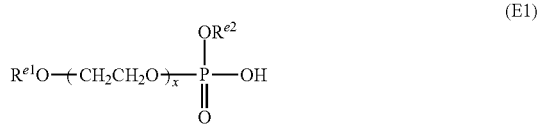
(E1)

In the above formula (E1), $R^{e1}$ represents an alkyl group or an alkylallyl group having 1 to 10 carbon atoms; $R^{e2}$ represents a hydrogen atom or $(CH_2CH_2O)R^{e1}$ (wherein $R^{e1}$ is as defined above); and x represents an integer of 1 to 20.

Specifically, as such a surfactant based on a phosphoric acid ester of polyoxyethylene, commercially available products such as "Plysurf A212E" and "Plysurf A210G" (both manufactured by Dai-ichi Kogyo Seiyaku Co., Ltd.) can be preferably used.

The aforementioned nonionic surfactant is preferably an alkyl etherified product of polyoxyalkylene, or an alkylamine oxide compound.

As the alkyl etherified product of polyoxyalkylene, a compound represented by the following formula (E2) or (E3) is preferably used.

(E2)

(E3)

In the above formulae (E2) and (E3), $R^{e3}$ and $R^{e4}$ represent a linear, branched or cyclic alkyl group, an alkyl group having a hydroxyl group, or an alkylphenyl group respectively having 1 to 22 carbon atoms. $A_O$ represents an oxyalkylene group, and is preferably at least one selected from oxyethylene, oxypropylene, and oxybutylene groups. The symbol y represents an integer.

As the alkylamine oxide compound, a compound represented by the following formula (E4) or (E5) is preferably used.

(E4)

(E5)

In the above formulae (E4) and (E5), $R^{e5}$ represents an alkyl group or a hydroxyalkyl group having 8 to 20 carbon atoms which may be interrupted with an oxygen atom, and p represent an integer of 1 to 5.

Examples of the alkylamine oxide compound represented by the above formula (E4) or (E5) include octyldimethylamine oxide, dodecyldimethylamine oxide, decyldimethylamine oxide, lauryldimethylamine oxide, cetyldimethylamine oxide, stearyldimethylamine oxide, isohexyldiethylamine oxide, nonyldiethylamine oxide, lauryldiethylamine oxide, isopentadecylmethylethylamine oxide, stearylmethylpropylamine oxide, lauryldi(hydroxyethyl)amine oxide, cetyldiethanolamine oxide, stearyldi(hydroxyethyl)amine oxide, dodecyloxyethoxyethoxyethyldi(methyl)amine oxide, stearyloxyethyldi(methyl)amine oxide, and the like.

The added amount of such a surfactant, if any, is preferably 1 ppm by mass to 10 mass %, more preferably 100 ppm by mass to 2 mass % when the total mass of the coating agent is taken as 100 mass %.

Water-Soluble Fluorine Compound

A property of not generating a suspension in the coating agent and the like is required for the water-soluble fluorine compound. Further, in a case where the coating agent contains the (D) water-soluble polymer or the alkali-soluble polymer, the water-soluble fluorine compound desirably has a high solubility in the (D) water-soluble polymer or the alkali-soluble polymer. The use of a water-soluble fluorine compound that complies with such characteristics can improve the leveling property (the extent of the spreading of the coating agent). Although this leveling property can be achieved by lowering of the contact angle by adding an excessive amount of surfactant, when the amount of the surfactant added is in excess, the application improving ability cannot be achieved at a certain level or higher, and furthermore, by adding an excess amount, the air bubbles (microfoam) may be generated on the coat film depending on the application conditions, thereby leading to a problem of potentially causing defects. By combining this water-soluble fluorine compound, the contact angle is lowered while suppressing such foaming, and thus leveling properties can be improved.

As the water soluble fluorine compound, fluoroalkyl alcohols, fluoroalkylcarboxylic acids and the like are preferably used. Examples of the fluoroalkyl alcohols include 2-fluoro-1-ethanol, 2,2-difluoro-1-ethanol, trifluoroethanol, tetrafluoropropanol, octafluoroamyl alcohol, and the like. Examples of the fluoroalkylcarboxylic acids include trifluoroacetic acid, and the like. However, the fluoroalkylcarboxylic acid is not limited to such exemplified compounds, and is acceptable as long as it is a fluorine compound having water solubility, and exhibits the effects described above. In particular, fluoroalkyl alcohols having 6 or less carbon atoms may be preferably used. Among these, in light of ready availability and the like, trifluoroethanol is particularly preferred.

The added amount of such a water-soluble fluorine compound, if any, is preferably 1 ppm by mass to 10 mass %, more preferably 100 ppm by mass to 2 mass % when the total mass of the coating agent is taken as 100 mass %.

Method of Forming a Fine Pattern

A positive-type resist pattern which is slimmed more than that in a positive-type resist pattern before coated with a coat film, can be obtained by coating a positive-type resist pattern on a substrate with the aforementioned coating agent for forming fine pattern, and then dissolving and removing the coat film from the positive-type resist pattern subject to heating. Below, a method of forming a fine pattern using the aforementioned coating agent will be described in detail.

Fabrication of a substrate having a positive-type photoresist pattern is not particularly limited, but may be performed by using a usual method for fabricating a semiconductor device, a liquid crystal display device, a magnetic head, micro lens, or the like. For example, a positive-type photoresist composition is coated on a substrate such as a silicon wafer using a spinner, and then dried to form a photoresist layer. After this, active rays such as ultraviolet rays, deep-UV, and exciplex laser light are irradiated through a desired mask pattern in a vacuum or through the liquid having a predetermined refractive index using a reduction projection exposure device, and the like, or a pattern is drawn by an electron beam, and then the substrate is heated. Next, the development is conducted with a developing solution, for example, an aqueous alkali solution, such as 1 to 10% by mass of an aqueous tetramethyl ammonium hydroxide (TMAH) solution to form the positive-type photoresist pattern on the substrate.

Note that there is no particular limitation for the positive-type photoresist composition used as a material for a positive-type resist pattern as long as it can be developed with an alkaline developing solution. The following can be used: a positive-type photoresist composition for the i, g line; a positive-type photoresist composition for excimer laser such as KrF, ArF, $F_2$; in addition, a positive type photoresist composition for EB (electron beam); a positive-type photoresist for EUV; widely used common positive type photoresist compositions.

Subsequently, the coating agent is applied over the entire surface of a substrate having a positive-type photoresist pattern to coat the positive-type photoresist pattern with a coat film comprising the coating agent. A coating method can be performed in accordance with the method commonly performed in the conventional heat flow process. That is, the above coating agent is applied over the positive resist pattern by a known application method such as spin-coating method using spinner, the bar coater method, the roll coater method, and the slit coater method.

After forming a coat film, heat treatment may be performed, if desired. There is no particular limitation for the heat-treatment temperature as long as good slimming treatment of a positive-type resist pattern can be performed, but it is preferred to heat at a temperature where the positive-type resist pattern does not undergo thermal fluidization. The temperature where a positive-type resist pattern does not undergo thermal fluidization refers to a temperature at which no change in the dimension of the above positive-type resist pattern is caused (for example, a change in the dimension due to spontaneous fluidization) when heating a substrate on which a coat film comprising the coating agent is not formed, and only the above positive-type resist pattern is formed. By performing heating treatment at such a temperature, the solubilization of the surface layer of a patterned section in a positive-type resist pattern can be promoted, and a well slimmed positive-type resist pattern having a reduced roughness can be obtained.

The temperature at which a positive-type resist pattern coated with a coat film comprising the coating agent is preferably 60 to 140° C., more preferably 80 to 120° C. There is no particular limitation for the heating time as long as it is in a range where the objects of the present invention are not impaired, but it is preferably for 30 to 90 seconds.

Further, there is no particular limitation for the thickness of a coat film comprising the coating agent, as long as a positive-type resist pattern can be coated.

After forming a film or after the aforementioned heat treatment, a coat film comprising the coating agent which remains on a substrate having a positive-type resist pattern is removed by washing with an aqueous solvent, preferably with pure water. By doing this, the surface layer of a resist section in the positive-type resist pattern is dissolved in washing water along with the coat film to form a slimmed positive-type resist pattern.

Note that before washing with water, the substrate having a coat film comprising the coating agent may be washed with an alkaline aqueous solution (for example, tetramethylammonium hydroxide (TMAH), choline and the like), if desired. In a case where water washing is performed after washing with an alkaline aqueous solution, the coat film and the surface layer of a resist section in the positive-type resist pattern are well dissolved, and the positive-type resist pattern is well slimmed.

Note that the steps described above may be repeatedly performed until the patterned section in the positive-type resist pattern is slimmed to a desired extent.

By the method described above, a fine pattern in which a patterned section in a positive-type resist pattern is well slimmed and the roughness is reduced can be formed by performing fining of the positive-type resist pattern using the aforementioned coating agent containing the (A) nitrogen-containing compound with a specific structure and the (B) organic solvent.

EXAMPLES

Below, the present invention will be described in more detail with reference to Examples, but the present invention shall not be limited to these Examples.

Examples 1 to 34 and Comparative Example 1

In Examples, the following compounds A1 and A2 were used as a nitrogen-containing compound as the (A) component.

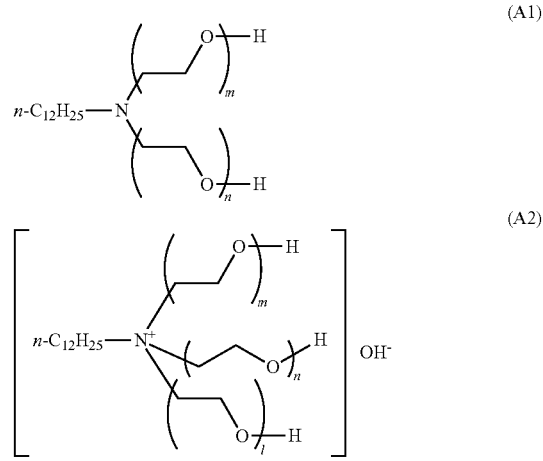

(In A1, the sum of m and n is 7 on average. In A2, the sum of m, n and 1 is 7 on average.)

In Examples and Comparative Examples, the following B1 to B3 were used as an organic solvent as the (B) component.
B1: 4-methyl-2-pentanol
B-2: propylene glycol monobutyl ether (1-butoxy-2-propanol)
B-3: propylene glycol monopropyl ether (1-propoxy-2-propanol)

In Examples, the following C1 to C7 were used as a basic nitrogen-containing compound as the (C) component.
C1: benzyltrimethylammonium hydroxide
C2: triisopropanolamine
C3: diisopropanolamine
C4: monoisopropanolamine
C5: monomethylethanolamine
C6: 1,4-diazabicyclo(2,2,2)octane
C7: 1,8-diazabicyclo(5,4,0)-7-undecene In Examples and Comparative Examples, the following D1 to D3 were used as a water-soluble polymer or an alkali-soluble polymer as the (D) component.

D1: polyvinylpyrrolidone (K30, Nippon Shokubai Co., Ltd.)
D2: poly(N,N-dimethylacrylamide) (mass-average molecular weight: 150,000)
D3: polyhydroxystyrene (mass-average molecular weight: 2,500)

The coating agents of Examples and Comparative Examples were each obtained by dissolving the components (A), (C) and (D) each shown in Table 1 into the (B) component shown in Table 1 to give a concentration each shown in Table 1.

(Evaluation)

After applying an antireflective-film coating liquid (Brewer Science Inc., ARC-29A) on a 12-inch silicon wafer, it was heat-treated for 60 seconds at 205° C. to provide an antireflective film having a film thickness of 89 nm. After applying a positive-type resist composition (Tokyo Ohka Kogyo Co., Ltd., TARF-PI6-144ME) on this antireflective film using a spinner, it was heat-treated for 60 seconds at 120° C. to form a resist film having a film thickness of 120 nm. Exposure treatment was performed on the resist film formed as described above through a mask for forming a line- and space pattern with lines and spaces each having a width of 60 nm, and then heat treatment was performed at 90° C. for 60 seconds. Then, development treatment was performed with a 2.38 mass % aqueous solution of TMAH (tetramethylammonium hydroxide), and then a rinse with ion-exchanged distilled water was performed to obtain a line-and-space pattern.

The coating agents of Examples or Comparative Example were each applied on the surface of a substrate having a line-and-space pattern using a spinner so that the film thickness of a coat film became 60 nm to coat the surface of the line-and-space pattern with a coat film comprising the coating agent. Subsequently, the coat film was removed from the surface of the line-and-space pattern with a 2.38 mass % aqueous solution of TMAH, and then ion exchanged distilled water was brought into contact with the coat film for 100 seconds. The following evaluations were performed for the resulting line-and-space pattern subjected to fining treatment.

Note that in a case where the coating agents of Examples or Comparative Examples indicated as "Yes" under the heading of "Baking" in Table 1 were used, the line-and-space pattern coated with the coat film was heat-treated at 100° C. for 60 seconds before removing the coat film with the aqueous solution of TMAH.

[Evaluation of Fining Amount of Line Width]

First, the line-and-space pattern before performing fining treatment was observed under a scanning electron microscope to measure line widths at 400 locations. The mean value of line width values at 400 locations was calculated, and the calculated mean value was taken as a line width W1 (nm). For each of the line-and-space patterns subjected to fining treatment using the coating agents of Examples and Comparative Examples, the mean value of line widths at 400 locations was also calculated, and the calculated mean value was taken as a line width W2 (nm).

From W1 and W2 computed as described above, the fining amount of line width $\Delta W$ (nm) was computed according to the following expression.

$$\Delta W = W1 - W2$$

Table 1 shows the fining amount of line width $\Delta W$ for the line-and-space pattern subjected to fining treatment using each of the coating agents of Examples and Comparative Examples. Note that a negative value of $\mu W$ means that the line width after fining treatment with the coating agent is increased as compared with the untreated line width.

[Evaluation of the Reduction Amount of Line Width Roughness (LWR)]

First, the line-and-space pattern before performing fining treatment was observed under a scanning electron microscope to measure line widths at 400 locations. The standard deviation ($\sigma$) in line width was computed from the values of line widths at 400 locations. Subsequently, a 3-fold value ($3\sigma$) of the standard deviation was computed, and the value of $3\sigma$ was taken as the roughness (R1, nm) of the lines in the untreated line-and-space pattern.

For each of the line-and-space patterns subjected to fining treatment using the coating agents of Examples and Comparative Examples, line widths at 400 locations were also measured to compute the roughness (R2, nm) of the lines in the line-and-space pattern subjected to fining treatment as in R1.

From R1 and R2 computed, the reduction amount of LWR, $\Delta R$ (nm) was computed according to the following expression.

$$\Delta R = R1 - R2$$

Table 1 shows the reduction amounts of LWR, $\Delta R$ for the line-and-space patterns subjected to fining treatment using the coating agents of Examples.

TABLE 1

| | Components in the coating agent | | | | | | | | Fining | |
| | (A) | | (B) | (C) | | (D) | | | amount | Reduction |
| | Type | Content (% by mass) | Type | Type | Content (% by mass) | Type | Content (% by mass) | Bake | of line width (nm) | amount of LWR (nm) |
|---|---|---|---|---|---|---|---|---|---|---|
| Ex. 1 | A1 | 0.2 | B1 | — | — | — | — | Baked | 7.7 | 4.2 |
| Ex. 2 | A1 | 0.1 | B1 | — | — | D1 | 1.0 | Not baked | 5.3 | 5.6 |
| Ex. 3 | A1 | 0.1 | B1 | C1 | 0.1 | D1 | 1.0 | Not baked | 8.3 | 5.4 |
| Ex. 4 | A1 | 0.1 | B1 | C1 | 0.3 | D1 | 1.0 | Not baked | 15.0 | 5.5 |
| Ex. 5 | A1 | 0.2 | B1 | C1 | 0.1 | D1 | 1.0 | Not baked | 10.3 | 5.1 |
| Ex. 6 | A1 | 0.2 | B1 | C1 | 0.3 | D1 | 1.0 | Not baked | 21.7 | 3.8 |
| Ex. 7 | A1 | 0.1 | B1 | — | — | D1 | 1.0 | Baked | 4.4 | 5.4 |
| Ex. 8 | A1 | 0.1 | B1 | C1 | 0.1 | D1 | 1.0 | Baked | 8.4 | 3.9 |
| Ex. 9 | A1 | 0.1 | B1 | C1 | 0.3 | D1 | 1.0 | Baked | 18.2 | 3.7 |
| Ex. 10 | A1 | 0.2 | B1 | C1 | 0.1 | D1 | 1.0 | Baked | 13.2 | 4.9 |
| Ex. 11 | A1 | 0.2 | B1 | C1 | 0.3 | D1 | 1.0 | Baked | 24.3 | 4.6 |
| Ex. 12 | A1 | 0.1 | B1 | — | — | D2 | 1.0 | Not baked | 4.4 | 5.5 |

TABLE 1-continued

| | Components in the coating agent | | | | | | | Fining | Reduction |
|---|---|---|---|---|---|---|---|---|---|
| | (A) | | | (C) | | (D) | | amount | amount |
| | Type | Content (% by mass) | (B) Type | Type | Content (% by mass) | Type | Content (% by mass) | Bake | of line width (nm) | of LWR (nm) |
| Ex. 13 | A1 | 0.1 | B1 | C1 | 0.1 | D2 | 1.0 | Not baked | 8.4 | 3.9 |
| Ex. 14 | A1 | 0.1 | B1 | C1 | 0.3 | D2 | 1.0 | Not baked | 18.2 | 3.7 |
| Ex. 15 | A1 | 0.2 | B1 | C1 | 0.1 | D2 | 1.0 | Not baked | 13.2 | 4.9 |
| Ex. 16 | A1 | 0.2 | B1 | C1 | 0.3 | D2 | 1.0 | Not baked | 24.3 | 4.6 |
| Ex. 17 | A1 | 0.1 | B1 | — | — | D2 | 1.0 | Baked | 4.7 | 6.4 |
| Ex. 18 | A1 | 0.1 | B1 | C1 | 0.1 | D2 | 1.0 | Baked | 10.2 | 4.4 |
| Ex. 19 | A1 | 0.1 | B1 | C1 | 0.3 | D2 | 1.0 | Baked | 22.2 | 3.4 |
| Ex. 20 | A1 | 0.2 | B1 | C1 | 0.1 | D2 | 1.0 | Baked | 14.0 | 5.5 |
| Ex. 21 | A1 | 0.2 | B1 | C1 | 0.3 | D2 | 1.0 | Baked | 28.1 | 3.5 |
| Ex. 22 | A1 | 0.3 | B1 | C1 | 0.1 | D2 | 1.0 | Baked | 14.4 | 4.2 |
| Ex. 23 | A1 | 0.5 | B1 | C1 | 0.1 | D2 | 1.0 | Baked | 19.4 | 4.0 |
| Ex. 24 | A1 | 0.1 | B1 | C2 | 0.5 | D2 | 1.0 | Baked | 17.5 | 3.9 |
| Ex. 25 | A1 | 0.1 | B1 | C3 | 0.5 | D2 | 1.0 | Baked | 14.0 | 5.1 |
| Ex. 26 | A1 | 0.1 | B1 | C4 | 0.5 | D2 | 1.0 | Baked | 10.2 | 3.9 |
| Ex. 27 | A1 | 0.1 | B1 | C5 | 0.5 | D2 | 1.0 | Baked | 11.3 | 5.8 |
| Ex. 28 | A1 | 0.1 | B1 | C6 | 0.3 | D2 | 1.0 | Baked | 6.1 | 4.4 |
| Ex. 29 | A1 | 0.1 | B1 | C6 | 0.5 | D2 | 1.0 | Baked | 6.6 | 5.3 |
| Ex. 30 | A1 | 0.1 | B1 | C7 | 0.3 | D2 | 1.0 | Baked | 14.9 | 5.6 |
| Ex. 31 | A1 | 0.1 | B1 | C7 | 0.5 | D2 | 1.0 | Baked | 20.1 | 3.7 |
| Ex. 32 | A2 | 0.1 | B1 | C1 | 0.3 | D2 | 1.0 | Baked | 21.3 | 4.1 |
| Ex. 33 | A1 | 0.1 | B2 | C1 | 0.3 | D2 | 1.0 | Baked | 24.8 | 4.5 |
| Ex. 34 | A1 | 0.1 | B3 | C1 | 0.3 | D2 | 1.0 | Baked | 21.2 | 5.2 |
| Comp. Ex. 1 | — | — | B1 | — | — | D3 | 2.0 | Baked | 0.7 | 4.8 |

Examples 1 to 34 reveal that in a case where a positive-type resist pattern is treated by a predetermined method using a coating agent containing the (A) nitrogen-containing compound with a predetermined structure and the (B) organic solvent, slimming and roughness reduction of the positive-type resist pattern can be simultaneously achieved.

Further, Examples 1 to 34 reveal that in a case where a coating agent containing the (C) basic nitrogen-containing compound and the (D) water-soluble polymer or the alkali-soluble polymer was used, the effects of slimming and roughness reduction is higher than a case where a coating agent not containing the above materials is used.

Furthermore, when the shape of a resist section in the positive-type resist pattern treated with each of the coating agents of Examples 1 to 34 was observed under a scanning electron microscope, the height of the resist section was unchanged as compared with that before the treatment, and the cross-sectional shape of the resist section is of a good rectangle.

Comparative Example 1 shows that in a case where a coating agent containing the alkali-soluble polymer but not the (A) nitrogen-containing compound with a predetermined structure is used to treat a positive-type resist pattern by a predetermined method, the roughness of the positive-type resist pattern is improved to some extent, but the positive-type resist pattern is mostly un-slimmed.

What is claimed is:

1. A method of slimming treatment of a positive-type resist pattern, the method comprising:
    coating a positive-type resist pattern on a substrate with a coat film comprising a coating agent,
    dissolving and removing the coat film from the positive-type resist pattern, and
    obtaining a positive-type resist pattern having a resist section in the pattern finer than that in the positive-type resist pattern before coated with the coat film, wherein the coating agent comprises an (A) nitrogen-containing compound and a (B) organic solvent,
    wherein the (A) nitrogen-containing compound is a compound having an alkyl group, bound to a nitrogen atom, with 8 or more carbon atoms and 4 moles or more of ethylene oxide and/or propylene oxide is bound to 1 mole of the nitrogen atom bound to the alkyl group,
    wherein the coating agent optionally comprises water in the amount of 10 mass % or less based on the 100 mass % of the coating agent.

2. The method according to claim 1, wherein the (A) nitrogen-containing compound is a compound represented by the following formula (1) or formula (2):

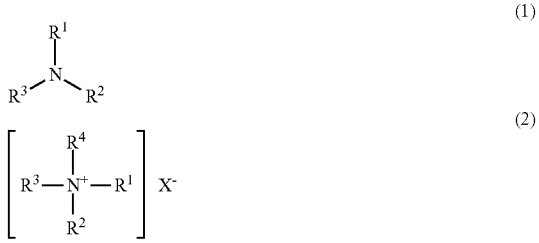

wherein, in the formula (1), $R^1$ represents an alkyl group having 8 or more carbon atoms, and $R^2$ represents a group represented by -(A-O)$_q$—$R^5$, and $R^3$ represents a hydrogen atom, an alkyl group, a hydroxyalkyl group or a group represented by -(A-O)$_r$—$R^5$;

in the formula (2), $R^1$ and $R^2$ are similarly defined as in the formula (1), and $R^3$ represents an alkyl group, a hydroxyalkyl group or a group represented by -(A-O)$_r$—$R^5$, and $R^4$ represents an alkyl group, a hydroxyalkyl group or a group represented by -(A-O)$_s$—$R^5$, and $X^-$ represents a monovalent anion; and "A" represents an ethylene group or a propylene group, and $R^5$ represents a hydrogen atom or an alkyl group, and q, r and s are the numbers of average repetitions of a divalent group represented by -A-O—, and q is a positive number, and r and s are each 0 or a positive number, and q+r+s is 4 or more.

3. The method according to claim 2, wherein in the formula (1), $R^3$ is a group represented by $-(A-O)_r$—H.

4. The method according to claim 2, wherein in the formula (2), $R^3$ is a group represented by $-(A-O)_r$—H, and $R^4$ is a group represented by $-(A-O)_s$—H.

5. The method according to claim 1, wherein the (B) organic solvent is one or more selected from the group consisting of alcohols optionally having a fluorine atom, hydrocarbons, ethers not having a hydroxy group and fluorinated aliphatic hydrocarbons optionally having an ether linkage or an ester linkage.

6. The method according to claim 1, wherein the coating agent further comprises a (C) basic nitrogen-containing compound other than the (A) nitrogen-containing compound.

7. The method according to claim 6, wherein the (C) basic nitrogen-containing compound is a quaternary ammonium hydroxide represented by the following formula (C1):

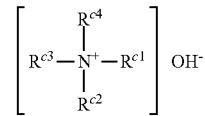

(C1)

wherein, in the formula (C1), $R^{c1}$, $R^{c2}$, $R^{c3}$, $R^{c4}$ are the same, or are different, and each independently represents a group selected from the group consisting of an alkyl group, a hydroxyalkyl group and an aralkyl group.

8. The method according to claim 1, wherein the coating agent further comprises a (D) water-soluble polymer or an alkali-soluble polymer.

9. The method according to claim 1 further comprising heating the positive-type resist pattern after being coated with the coat film.

* * * * *